US011561710B2

(12) United States Patent
Cariello et al.

(10) Patent No.: US 11,561,710 B2
(45) Date of Patent: *Jan. 24, 2023

(54) PROGRAMMABLE PEAK POWER MANAGEMENT

(71) Applicant: Micron Technology, Inc., Boise, ID (US)

(72) Inventors: Giuseppe Cariello, Boise, ID (US); Chiara Cerafogli, Boise, ID (US); Marco Domenico Tiburzi, L'Aquila (IT); Fulvio Rori, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 28 days.

This patent is subject to a terminal disclaimer.

(21) Appl. No.: 17/140,600

(22) Filed: Jan. 4, 2021

(65) Prior Publication Data

US 2021/0124511 A1 Apr. 29, 2021

Related U.S. Application Data

(63) Continuation of application No. 16/452,228, filed on Jun. 25, 2019, now Pat. No. 10,884,638.

(51) Int. Cl.
*G06F 3/06* (2006.01)

(52) U.S. Cl.
CPC ......... *G06F 3/0632* (2013.01); *G06F 3/0604* (2013.01); *G06F 3/0659* (2013.01); *G06F 3/0679* (2013.01)

(58) Field of Classification Search
None
See application file for complete search history.

(56) References Cited

U.S. PATENT DOCUMENTS

| | | | |
|---|---|---|---|
| 10,884,638 B1 | 1/2021 | Cariello et al. | |
| 2002/0073348 A1* | 6/2002 | Tani | G06F 1/26 713/300 |
| 2013/0326124 A1* | 12/2013 | Zafarana | G06F 12/0246 713/310 |
| 2014/0201547 A1* | 7/2014 | Tanpure | G06F 1/3225 713/320 |
| 2014/0380066 A1 | 12/2014 | Takayanagi et al. | |
| 2015/0186049 A1 | 7/2015 | Scouller et al. | |
| 2019/0198114 A1 | 6/2019 | Ben-Rubi | |
| 2019/0205244 A1 | 7/2019 | Smith | |
| 2020/0409577 A1 | 12/2020 | Cariello et al. | |

* cited by examiner

*Primary Examiner* — Edward J Dudek, Jr.
*Assistant Examiner* — Ralph A Verderamo, III
(74) *Attorney, Agent, or Firm* — Greenberg Traurig

(57) ABSTRACT

The disclosure describes a programmable power management system for NAND Flash devices. In one embodiment, dedicated match logic is provided to store program counters responsible for peak power consumption of one or more NAND Flash dies. Upon detecting that a current program counter equals a stored program counter, a high current enable signal is toggled causing at least one NAND Flash die to suspend operations, thereby reducing peak power consumption of the NAND Flash device.

20 Claims, 4 Drawing Sheets

PROGRAMMABLE PEAK POWER MANAGEMENT

RELATED APPLICATION

The present application is a continuation application of U.S. patent application Ser. No. 16/452,228, filed Jun. 25, 2019, issued as U.S. Pat. No. 10,884,638 on Jan. 5, 2021, entitled "PROGRAMMABLE PEAK POWER MANAGEMENT," the disclosure of which application is hereby incorporated by reference herein in its entirety.

FIELD OF THE TECHNOLOGY

At least some embodiments disclosed herein relate to power management of digital devices in general and, more particularly but not limited to, a programmable power management system for NAND Flash devices.

BACKGROUND

Certain operations on NAND Flash devices result in increased current drawn by the NAND dies. For example, warming up a word line or discharging/charging a bit line draw significant current from a power source in order to perform the operations. These operations are caused by underlying firmware code that perform the operations during the operation of the NAND Flash device.

Current NAND devices rely on explicit commands placed within firmware code to indicate when such peak power sections of firmware code occur. The NAND firmware uses these flags to enable and disable peak power management operations of the NAND device.

These systems, however, are static in nature. The use of specific firmware commands results in new firmware being issued if the peak power section of a given algorithm changes. These changes may be due to operating requirements of the NAND Flash or a changing location where peak power is drawn. Thus, a manufacturer of NAND Flash is required to issue updated or revised firmware to account for such changes in peak power usage.

Thus, there exists a need in the art for techniques for dynamically detecting peak power sections of NAND firmware code.

BRIEF DESCRIPTION OF THE DRAWINGS

The embodiments are illustrated by way of example and not limitation in the figures of the accompanying drawings in which like references indicate similar elements.

DETAILED DESCRIPTION

Aspects of the present disclosure are directed to systems, devices, methods, and computer-readable media for programmatically managing power peaks in a memory system. The disclosed embodiments utilize a lookup table of firmware program counters responsible for power peaks and, upon sniffing that a current program counter is in the table, toggle a high current enable signal which blocks one or more NANDs while a first NAND execute a peak power operation. The disclosed embodiments additionally describe dedicated circuitry that can dynamically detect program counters associated with power peaks and can update the lookup table based on this detection.

Figure 1:
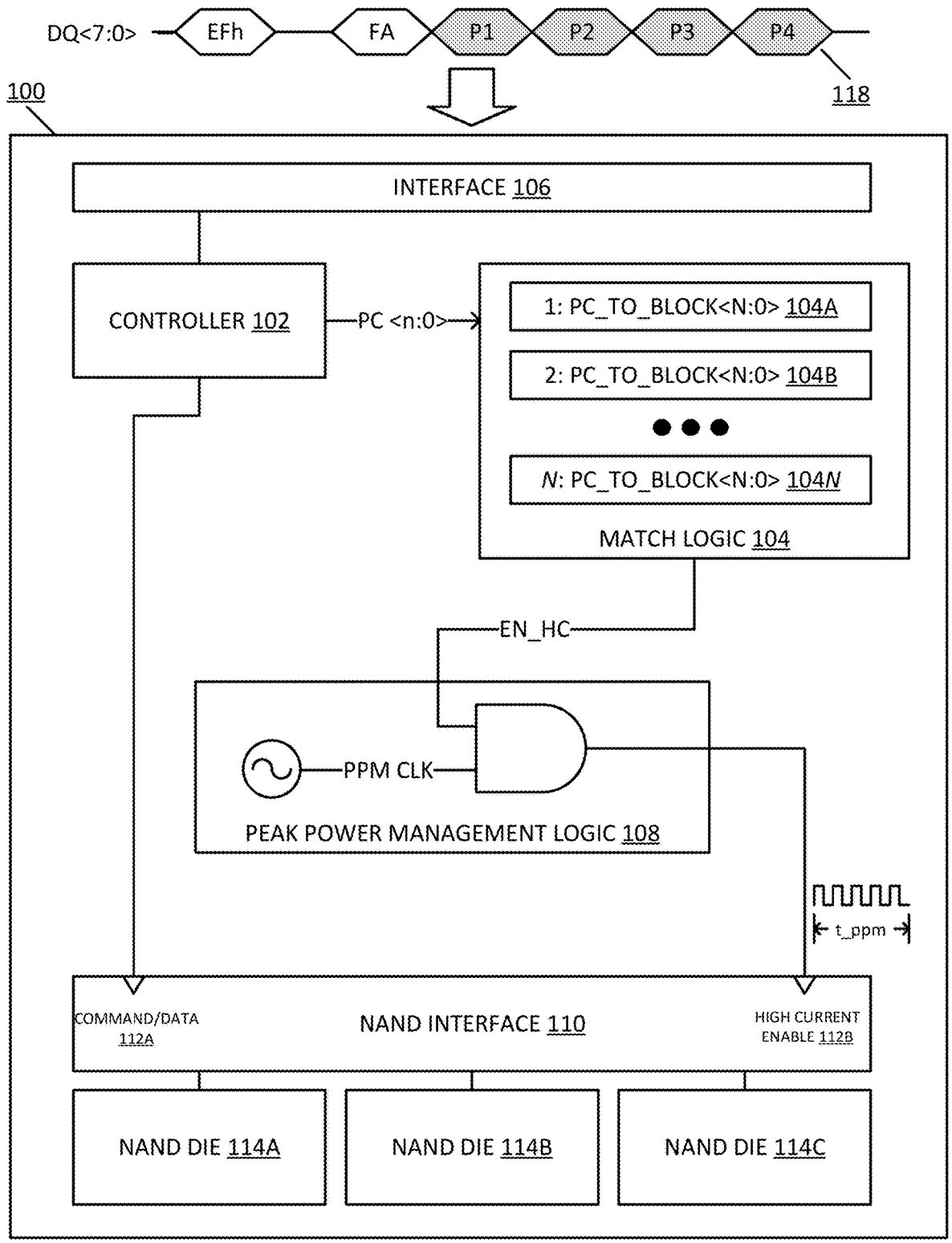
FIG. 1 is a block diagram of a memory system with programmable peak power management according to some embodiments of the disclosure.

FIG. 1 is a block diagram of a memory system with programmable peak power management according to some embodiments of the disclosure.

In the illustrated embodiment, a memory system (100) receives commands (such as command 118) from a host device (not illustrated). The memory system (100) receives commands via an interface (106). The interface (106) can comprise a physical and/or logical interface. In one embodiment, the interface (106) comprises a pinout of a microprocessor or microcontroller. Such a pinout can comprise numerous inputs and outputs to the memory system (100) such as an address latch enable (ALE), chip enable (CE #), command latch enable (CLE), block lock (LOCK), read enable (RE #), write enable (WE #), write protect (WP #), input/output bus (I/O[ n:0]), and ready/busy output (R/B) signal. The specific pinout of the memory system (100) is not intended to be limiting and generally only requires functionality to enable reading and writing data to the memory system (100). Logically, the memory system (100) can implement one or more sets of commands processible by the controller (102). For example, the memory system (100) can implement a standardized Flash interface such as Open NAND Flash Interface (ONFI) maintained by the ONFI Working Group.

The controller (102) is primarily responsible for receiving the commands over interface (106) and translating the commands into memory accesses of NAND dies (114a-c) via NAND interface (110). Additionally, controller (102) can initialize bad block tables for the dies (114a-c), perform low-level formatting, perform error code correction, manage buffers, and other features. As illustrated, controller (102) is coupled to a command/data input (112a) of the NAND interface (110). This input (112a) is configured to receive the read/write data to be read/written (respectively) from individual NAND dies (114a-c). In the illustrated embodiment, controller (102) includes a firmware (not illustrated) that stores instructions to execute when accessing NAND dies (114a-c). Thus, upon receiving a command over interface (106), controller (102) loads the corresponding executable firmware code and executes the firmware code. In some embodiments, this firmware results in reads/writes from NAND dies (114a-c) via NAND interface (110). In other embodiments, the firmware performs administrative or configuration tasks of the memory system (100). The details of accessing Flash dies via a Flash controller are only briefly described above and the embodiments are intended to encompass all possible operations on Flash dies known in the art.

As illustrated, the NAND interface (110) includes a high current enable (HC #) input (112b). The HC #input (112b) controls the timing of operations of each of the NAND dies (112a). Specifically, when a high current mode is enabled, a toggling signal (t_ppm) is sent to HC #input (112b). One or more of the NAND dies (114a-c) detect the toggling and pause operations of any currently executing (or pending) operations. Alternatively, or in conjunction with the foregoing, the NAND dies (114a-c) may block execution of all future commands until detecting that the toggling on HC #input (112b) is completed. In one embodiment, the HC #input (112b) is multiplexed using a currently active NAND die number and sent to all other dies other than a die currently affected by the program counter. Thus, if a program counter affecting die (114a) triggers the HC #input (112b), dies (114b and 114c) enter a blocking state.

HC #input (112b) is driven by peak power management (PPM) logic (108). The match logic (104) in turn drives the enabling of PPM logic (108). The controller (102) is responsible for managing the contents of match logic (104) in response to user-specific commands (e.g., 118) as well as automatically in some embodiments. Details of automatically configuring match logic (104) are described more fully in the description of FIG. 4. In some embodiments, the match logic (104) comprises a static random-access memory (SRAM) device. In some embodiments, the match logic (104) can comprise a DRAM device or other type of storage device. Generally, the match logic (104) can comprise volatile memory or non-volatile memory based on the needs of the device.

In the illustrated embodiment, match logic (104) comprises a lookup table of blocked program counters. A program counter refers to the address of currently executing software. As described above, controller (102) executes software stored in firmware and thus a program counter maintains the address of firmware code executing on the memory system (100). In one embodiment, a command (118) is used to identify program counters to insert into match logic (104). In one embodiment, these program counters refer to known sections of firmware code that increase the power consumption of a given die. For example, firmware code for ramping up a word line and charging or discharging a bit line result in increased power consumption by a corresponding die. Thus, program counters for these operations can be inserted into match logic (104). As illustrated, in one embodiment, a SET FEATURE (EFh) command can be sent to the memory system (100). After indicating the command (EFh), a feature address (FA) is provided which is mapped by the memory system (100) to a feature enabling the adding of program counters to match logic (104). Next, four bytes (P1, P2, P3, P4) are transmitted over the interface (106) forming the program counter to block. The controller (102) parses this command and adds the identified program counter to the list of other blocked program counters (104a-n) stored in match logic (104). In other embodiments (described in FIG. 4), circuitry can be added to the memory system (100) to monitor the power usage of each die (114a-114c). In response to detecting a peak in current, the controller (102) can identify the current program counter (stored in a dedicated program counter register) and add the current program counter to match logic (104).

In addition to adding program counters to match logic (104), the controller additionally provides (or exposes) the current program counter to match logic (104). Match logic (104) in turn includes comparison circuity (not illustrated) that determines if the currently executing program counter matches a stored program counter (104a-n). If not, the memory system (100) operates normally. If a match exists, however, the match logic (104) raises a high current enable flag (en_hc) which triggers the toggle signal (t_ppm). In the illustrated embodiment, the PPM logic (108) comprises an oscillator or other type of periodic signal and a logical AND gate. The inputs to the AND gate comprise the clock output of the oscillator and the en_hc flag. The output of the AND gate is connected to the HC #input (112b) of the NAND interface (110). Thus, when the en_hc flag is raised, the toggling signal is transmitted to HC #input (112b).

In the illustrated embodiment, t_ppm may comprise a toggling signal having a fixed length. Alternatively, the length of the signal may be varied or variable. In one embodiment, the length of t_ppm may be trimmable at the die level. Alternatively, or in conjunction with the foregoing, the length of t_ppm can be adjusted based on the blocked program counter. In this embodiment, the match logic (104) includes a length value for each program counter which controls how long the t_ppm signal is active for.

In one embodiment, toggling the toggling signal comprises toggling a current peak activated by a concurrent power supply voltage drop detected by on-chip chip or off-chip circuitry. In some embodiments, the detected voltage drop is selected from one or more selectable voltage drop levels.

Figure 2:
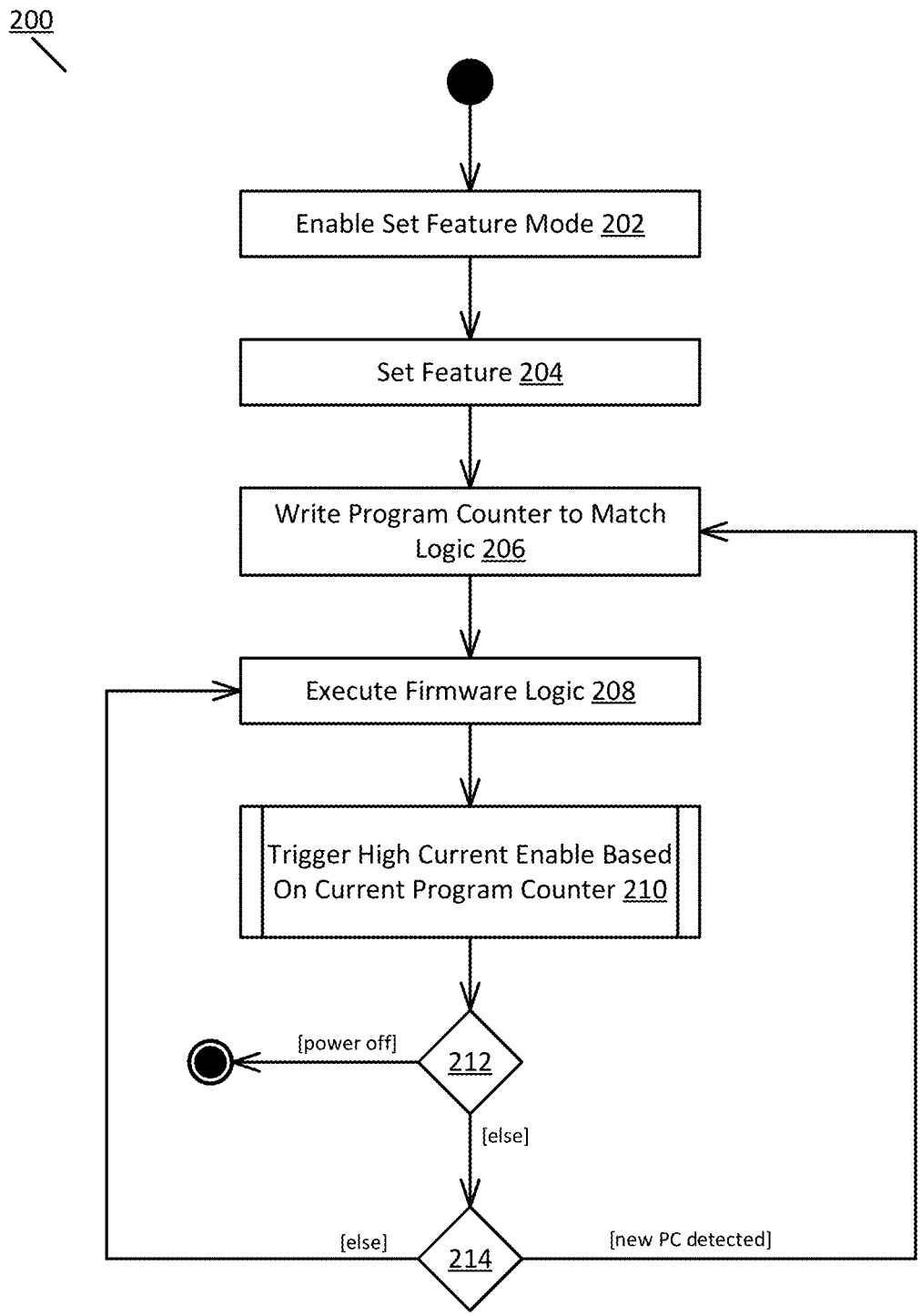
FIG. 2 is a flow diagram illustrating a method for programmatically managing a peak power mode in a NAND Flash device according to some embodiments of the disclosure.

FIG. 2 is a flow diagram illustrating a method (200) for programmatically managing a peak power mode in a NAND Flash device according to some embodiments of the disclosure. As used herein, a NAND Flash device or NAND device refers to a computing device that include NAND dies. Examples of NAND devices include solid state drives (SSDs), memory cards, universal serial bus (USB) storage devices, and any other device that utilizes NAND Flash memory.

In step 202, a set feature mode is enabled. In one embodiment, a host processor enables a set feature mode in response to a request from a user. In other embodiments (described below), the set feature mode may be enabled programmatically or via circuitry. The set feature mode can comprise any command to update or modify the operating mode of a NAND device. The set feature mode can be used to update settings of the NAND as well as update match logic (described in FIG. 1) of the NAND device, as described further herein.

In step 204, the method (200) sets a feature according to a received command.

In one embodiment, step 204 comprises inserting a program counter value into a match logic table (depicted in FIG. 1). In one embodiment, the set feature command received in 204 comprises a four-byte program counter transmitted after enabling the set feature mode in step 202. The specific width of the program counter is not limiting. Alternatively, or in conjunction with the foregoing, the set feature in step 204 includes a feature address that identifies the feature of the NAND to update. The specific address is not limiting. In general, the address allows the NAND to recognize that the future received data comprises a program counter to add to the match logic table.

In step 206, the method (200) writes the program counter to the match logic.

As described above, in some embodiments the match logic is a dedicated storage device for maintaining a list of program counters. Thus, in some embodiments, a small SRAM or DRAM package can be connected to a NAND Flash controller and used as a dedicated program counter cache.

In step 206, the method (200) writes the received program counter into the storage device (e.g., SRAM chip). In some embodiments, the storage device is used as a list wherein the first received program counter is stored at a location 0x00 while the second program counter is stored at location 0x01+D, where D is the program counter width. In this embodiment, the method (200) sequentially scans all memory addresses starting at zero until reaching a null value when attempting to locate a program counter. In other embodiments, the storage device can be sized based on the program counter width such that the address bus of the storage device is equal to the width of the program counter. In this embodiment, program counter values and memory locations are mapped one-to-one. Thus, when, for example, program counter value 0x00 is received, the value stored in memory at location 0x00 corresponds to an indication of whether the program counter is associated with a peak power portion of the firmware code.

In step 208, the method (200) executes firmware logic.

In one embodiment, the firmware logic includes one or more algorithms that manipulate a NAND chip. These algorithms are used to access and modify the cells of the NAND chip. Examples of algorithms include read, program, and erase algorithms. Each algorithm includes lower level steps for accessing the NAND. For example, toggling a bit or word line to facilitate reading/writing data from/to the NAND device.

Each instruction in the algorithms is associated with a program counter address. As the method (200) executes firmware instructions, the corresponding program counter addresses are stored within a dedicated program counter register.

In step 210, the method (200) triggers a high current enable based on the current program counter.

In one embodiment, the program counter register is communicatively coupled to the match logic. When the program counter matches a value stored in the match logic, the method (200) raises a high current enable signal. This signal activates peak power management logic which results in a toggling signal being sent to each NAND die indicating a peak power instruction is currently being executed. Further detail of step 210 is provided in the description of FIG. 3.

In step 212, the method (200) determines if the device is being powered off. If so, the method (200) ends. If not, the method (200) continues to the determine if a new program counter is detected (step 214).

In step 214, the method (200) determines that a new program counter is detected and should be placed in the match logic. In one embodiment, step 214 comprises detecting a SET FEATURE command as described previously. In other embodiments (discussed in FIG. 4), the method (200) may detect a new program counter to insert into the match logic by monitoring the power consumption of the NAND dies, extracting the program counter from the program counter register, and inserting the program counter value into the match logic.

If the method (200) does not detect that a new program counter should be added to the match logic, the method (200) continues to execute steps 208, 210, 212, and 214. In this branch, the method (200) continues to monitor program counter values and toggle a high current enable when needed.

In some embodiments, after or before step 214, the method (200) can determine if the high current enable signal is raised and, if so, whether the signal should be lowered based on a timing constraint. In some embodiments, the method (200) may limit the length of time the high current enable should be raised. In one embodiment, the method (200) may use a fixed amount of time. In this embodiment, the method (200) will keep the high current enable signal raised until the time period expires. In other embodiments, the match logic may store a timing parameter which dictates how long the high current enable signal should be raised. In some embodiments, this per-program counter timing value can be determined (and updated) based on analyzing the power consumption of the NAND dies after the associated program counter is identified (as described in the description of FIG. 4).

Figure 3:
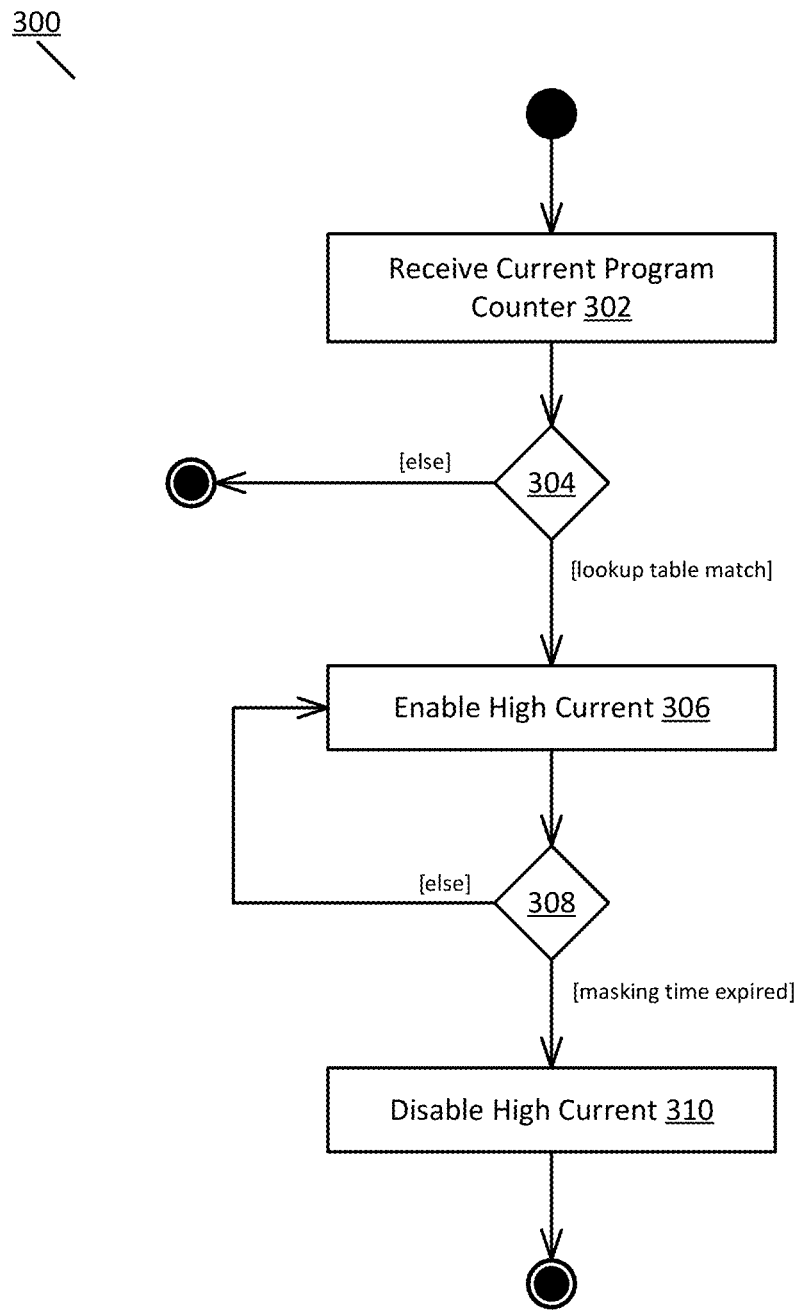
FIG. 3 is a flow diagram illustrating a method for toggling a peak power mode of a NAND Flash device according to some embodiments of the disclosure.

FIG. 3 is a flow diagram illustrating a method (300) for toggling a peak power mode of a NAND Flash device according to some embodiments of the disclosure.

In step 302, the method (300) receives a current program counter value.

As described above, the program counter value can be received by accessing or sniffing a program counter register maintained by a CPU or microcontroller. In some embodiments, the CPU or microcontroller can programmatically access the program counter register and forward the address in the register to the match logic.

In step 304, the method (300) determines if a match exists in a match logic lookup table.

In one embodiment, the method (300) accesses each location in the lookup table and determines if the stored value is equal to the program counter address received in step 302. In another embodiment, the method (300) accesses a location in the lookup table having the same value as the program counter and determines if the location contains a value. If so, a match exists. In some embodiments, the value can comprise any data or can comprise specific data such as timing information (discussed above).

If the method (300) determines that no match exists, the method (300) ends. Alternatively, if the method (300) determines that a match exists, the method (300) continues to step 306.

In step 306, the method (300) enables a high current signal. In a first embodiment, the method (300) access each memory location in the match logic and compares the value to the program counter. In this embodiment, the method (300) can logically AND the program counter and the values of memory. When a match occurs, the output of this gate is high, which can then be used as the high current signal (which defaults to low). In the second embodiment, the method (300) accesses the location in the match logic equal to the program counter. In this embodiment, the memory access yields either 0x0 (no match) or any other value. In this scenario, the method (300) logically ANDs each bit of the read memory word and uses the output as the high current signal.

As illustrated in FIG. 1, the high current signal is connected to a oscillator via a logic AND, thus when the high current signal is high, the oscillator output will be connected to a high current enable pad of the NAND interface.

In step 308, the method (300) determines if a masking time has expired.

If not, the method continues to raise the high current signal. If so, the method disables (i.e., lowers) the high current signal (step 310).

In one embodiment, the masking time comprises a fixed time to maintain the high current enable. In this embodiment, after detecting a program counter stored in the match logic, the method (300) sets a timer and maintains the high current signal regardless of program counter. In some embodiments, this timer can comprise a temporal timer or can comprise an integer number of instructions to block lowering the high current signal.

In another embodiment, the masking time can be set for each NAND die. Thus, if an instruction destined for a first NAND triggers the high current signal the masking time for the first NAND can be used as the masking time; whereas an instruction destined for a second NAND die would use the second NAND die's masking time.

In another embodiment, the masking time can be included within the match logic. In this embodiment, each individual program counter is associated with a per-instruction masking time. In some embodiments, this can be set via the SET FEATURE command. Alternatively, the per-instruction masking time can be created and refined based on monitoring the power consumption after a program counter address is detected.

Once the method (300) lowers the high current signal (step 310), the method (300) ends and is re-executed once a new program counter is received.

Figure 4B:
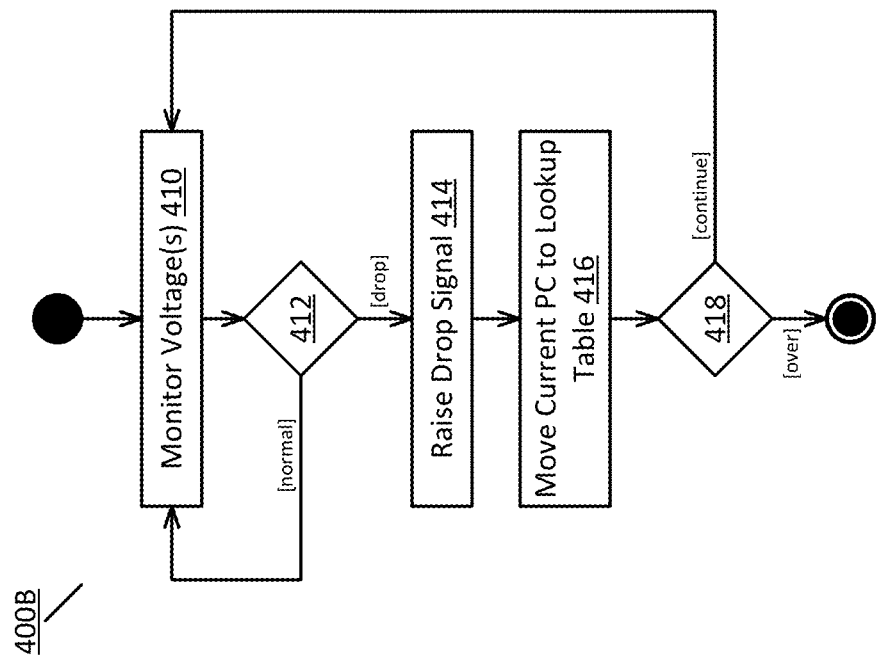
FIG. 4B is a flow diagram illustrating a method for detecting a peak power condition and updating a peak power lookup table according to some embodiments of the disclosure.
Figure 4A:
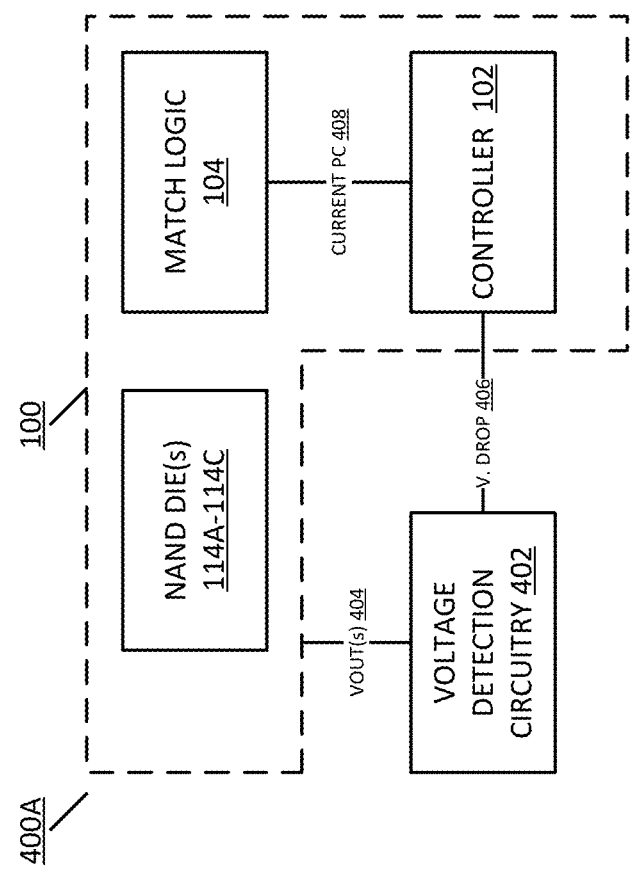
FIG. 4A is a block diagram illustrating an apparatus for detecting a peak power condition and updating a peak power lookup table according to some embodiments of the disclosure.

FIG. 4A is a block diagram illustrating an apparatus for detecting a peak power condition and updating a peak power lookup table according to some embodiments of the disclosure.

The illustrated apparatus (400a) includes NAND dies (114a-114c), controller (102) and match logic (104). These components comprise the same components described in FIG. 1 and the description of these components are not repeated herein.

The apparatus (400a) additionally includes voltage detection circuitry (402). In some embodiments, the voltage detection circuitry (402) comprises on-chip circuitry. In this embodiment, the voltage detection circuitry (402) is communicatively coupled to one or more voltage outputs (404) of the memory device (100). In other embodiments, voltage detection circuitry (402) can comprise off-chip circuitry. In this embodiment, the voltage detection circuitry (402) can be connected to the voltage outputs (404) of the memory system via a dedicated interface.

In the illustrated embodiment, the voltage detection circuitry (402) receives a reference voltage and a voltage under analysis (VUA), both voltages can be provided as a voltage output (404) of memory device (100). The voltage detection circuitry (402) includes one or more voltage detector circuits configured to detect a drop in voltage of the VUA when compared to the reference voltage. In one embodiment, the VUA comprises a complementary metal oxide semiconductor (CMOS) voltage of the memory device (100), although other types of variable voltage sources can be used. In some embodiments, the voltage detection circuitry (402) includes multiple voltage detectors and analyzes multiple VUA sources.

In the illustrated embodiment, the voltage detection circuitry (402) is configured to raise a signal indicating a voltage drop (406). This signal (406) is sent to the controller (102) which latches the current program counter (408) to match logic (104), causing the program counter to be inserted into the match logic (104) as described previously. These and other operations of the voltage detection circuitry (402) are described more fully in the description of FIG. 4B below.

FIG. 4B is a flow diagram illustrating a method for detecting a peak power condition and updating a peak power lookup table according to some embodiments of the disclosure.

In step 410, the method (400b) monitors an output voltage, or output voltages, of a memory device.

As described above, an output voltage refers to the operating voltage of at least a portion of a memory device. The output voltage can comprise a CMOS voltage of the memory device or other voltages of interest. In the illustrated embodiment, the method (400b) can monitor multiple voltages simultaneously. In this embodiment, the method (400b) is performed in parallel for each monitored voltage. The method (400b) can be executed during a calibration procedure or can be executed continuously while the memory device is operating.

In step 412, the method (400b) determines if the output voltage is operating within normal constraints. If so, the method (400b) continues to monitor the output voltage in step 410. As described above, the method (400b) can compare the output voltage to a reference voltage and can thus determine that an output voltage is operating within normal constraints if it is within the range of the reference voltage.

In step 414, the method (400b) raises a voltage drop signal. In one embodiment, the method (400b) raises high a signal to a controller or other device signifying that the voltage drop occurred.

In step 416, the method (400b) moves the current program counter into a match logic lookup table in response to detecting the voltage drop signal.

In some embodiments, the program counter register is latched to the address line of the lookup table. The voltage drop signal can then be used to enable the latch while the controller transmits a read command to the lookup table, thus automatically transferring the current program counter to the lookup table.

In some embodiments, the method (400b) can be configured to ignore repeated program counter insertions. For example, during iterative routines (e.g., pulse and verify loops), an offending program counter that triggers a voltage drop will be detected during each iteration of the routine. Thus, in these embodiments, the controller can limit the number of latched program counter inserts to one, to avoid repeated accesses of the lookup table.

In step 418, the method (400b) determines if the output voltage should continue to be monitored. If so, the method (400b) continues to monitor the output voltage(s) in step 410. If not, the method (400b) ends.

The method (400b) can be executed during a calibration procedure or can be executed continuously while the memory device is operating or can be executed in both scenarios. During a calibration procedure, various operations (e.g., read, program, erase) are executed according to a calibration plan. The method (400b) can be executed only during this calibration period and offending program counters are then inserted for each operation. In this embodiment, the method (400b) would end after the calibration procedure completes.

If implemented as part of a continuous monitoring, the method (400b) continuously monitors the output voltages for drops and periodically updates the lookup table when such drops occur. In some embodiments, the controller manages the contents of the lookup table and thus will insert a program counter address only when the address does not currently exist in the lookup table.

For simplicity, the preceding description describes the various functions and operations as being performed by or caused by computer instructions. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

While some embodiments can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computer system or other data processing system in response to its processor, such as a microprocessor or microcontroller, executing sequences of instructions contained in a memory, such as ROM, volatile RAM, non-volatile memory, cache, or a remote storage device.

Routines executed to implement the embodiments may be implemented as part of an operating system or a specific application, component, program, object, module, or sequence of instructions referred to as "computer programs." The computer programs typically comprise one or more instructions set at various times in various memory and storage devices in a computer, and that, when read and executed by one or more processors in a computer, cause the computer to perform operations necessary to execute elements involving the various aspects.

A tangible, non-transitory computer storage medium can be used to store software and data which, when executed by a data processing system, causes the system to perform various methods. The executable software and data may be stored in various places including for example ROM, volatile RAM, non-volatile memory and/or cache. Portions of this software and/or data may be stored in any one of these storage devices. Further, the data and instructions can be obtained from centralized servers or peer-to-peer networks. Different portions of the data and instructions can be obtained from different centralized servers and/or peer-to-peer networks at different times and in different communication sessions or in a same communication session. The data and instructions can be obtained in their entirety prior to the execution of the applications. Alternatively, portions of the data and instructions can be obtained dynamically, just in time, when needed for execution. Thus, it is not required that the data and instructions be on a machine-readable medium in their entirety at a particular instance of time.

Examples of computer-readable storage media include, but are not limited to, recordable and non-recordable type media such as volatile and non-volatile memory devices, read only memory (ROM), random access memory (RAM), flash memory devices, floppy and other removable disks, magnetic disk storage media, and optical storage media (e.g., Compact Disk Read-Only Memory (CD ROM), Digital Versatile Disks (DVDs), etc.), among others. The instructions may be embodied in a transitory medium, such as electrical, optical, acoustical, or other forms of propagated signals, such as carrier waves, infrared signals, digital signals, etc. A transitory medium is typically used to transmit instructions, but not viewed as capable of storing the instructions.

In various embodiments, hardwired circuitry may be used in combination with software instructions to implement the techniques. Thus, the techniques are neither limited to any specific combination of hardware circuitry and software, nor to any particular source for the instructions executed by the data processing system.

Although some of the drawings illustrate a number of operations in a particular order, operations that are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software, or any combination thereof.

The above description and drawings are illustrative and are not to be construed as limiting. Numerous specific details are described to provide a thorough understanding. However, in certain instances, well known or conventional details are not described to avoid obscuring the description. References to one or an embodiment in the present disclosure are not necessarily references to the same embodiment; and, such references mean at least one.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A device comprising:
a memory device;
a controller;
match logic configured to receive a current program counter address from the controller and generate a high current enable signal in response to determining that the current program counter address matches a known program counter address; and
peak power management logic configured to receive the high current enable signal and toggle a peak power mode of the memory device.

2. The device of claim 1, further comprising match logic comprising a lookup table populated with program counter addresses, the lookup table storing the known program counter address.

3. The device of claim 2, wherein the match logic comprises a static random-access memory (SRAM) device.

4. The device of claim 1, wherein the peak power management logic includes an oscillator.

5. The device of claim 4, wherein the peak power management logic comprises an AND gate, the inputs of the AND gate comprising an output of the oscillator and the high current enable signal.

6. The device of claim 2, further comprising external circuitry configured to monitor a power consumption of the memory device and instruct the controller to insert a new program counter address into the lookup table upon detecting a peak power condition.

7. The device of claim 1, wherein toggling a peak power mode of the memory device comprises toggling the peak power mode for a predetermined time interval.

8. The device of claim 7, wherein the predetermined time interval comprises a fixed time interval.

9. The device of claim 7, wherein the predetermined time interval comprises a time interval stored in a lookup table.

10. The device of claim 1, wherein toggling the peak power mode comprises toggling a current peak activated by a concurrent power supply voltage drop detected by on-chip or off-chip circuitry.

11. The device of claim 10, wherein the detected voltage drop comprises one or more selectable voltage drop levels.

12. A method comprising:
receiving a current program counter address; and
toggling a peak power mode of a memory device in response to determining that the current program counter address matches a known program counter address, the peak power mode causing at least one portion of the memory device to suspend operations.

13. The method of claim 12, further comprising populating a lookup table with at least one program counter address, the lookup table storing the known program counter address.

14. The method of claim 13, wherein populating the lookup table comprises inserting the at least one program counter address into a static random-access memory (SRAM) device.

15. The method of claim 12, further comprising enabling a high current enable signal in response to determining that the current program counter address is equal to the at least one program counter address.

16. The method of claim 15, wherein toggling a peak power mode comprises generating an oscillating signal.

17. The method of claim 16, wherein generating an oscillating signal comprises performing an AND operation on the oscillating signal and the high current enable signal.

18. The method of claim 13, further comprising monitoring a power consumption of the memory device and inserting a new program counter address into the lookup table upon detecting a peak power condition.

19. The method of claim 12, the toggling the peak power mode comprising toggling a current peak activated by a concurrent power supply voltage drop detected by on-chip or off-chip circuitry.

20. A non-transitory computer-readable storage medium for tangibly storing computer program instructions capable of being executed by a computer processor, the computer program instructions defining the steps of:
receiving a current program counter address; and
toggling a peak power mode of a memory device in response to determining that the current program counter address matches a known program counter address, the peak power mode causing at least one portion of the memory device to suspend operations.

* * * * *